Figure 1:
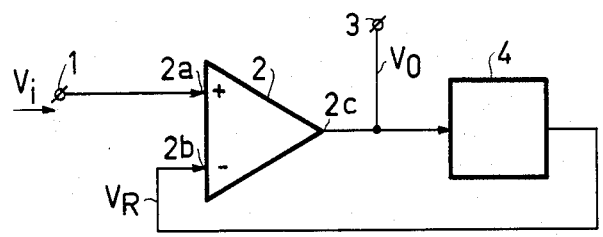

United States Patent

Schouhamer Immink et al.

[11] Patent Number: 4,499,570
[45] Date of Patent: Feb. 12, 1985

[54] DROPOUT CIRCUIT ARRANGEMENT FOR CONVERTING AN INFORMATION SIGNAL INTO A RECTANGULAR SIGNAL

[75] Inventors: Kornelis A. Schouhamer Immink; Ronaldus M. Aarts, both of Eindhoven, Netherlands

[73] Assignee: U.S. Philips Corporation, New York, N.Y.

[21] Appl. No.: 338,716

[22] Filed: Jan. 11, 1982

[30] Foreign Application Priority Data

Nov. 11, 1981 [NL] Netherlands ......................... 8105095

[51] Int. Cl.³ ........................ G11B 27/36; H04N 5/94
[52] U.S. Cl. ..................................... 369/48; 369/124; 369/59; 358/336; 360/38.1
[58] Field of Search ................... 369/124, 48, 109, 59; 358/336, 314; 360/38.1, 32; 307/359

[56] References Cited

U.S. PATENT DOCUMENTS

| 3,947,873 | 3/1976 | Buchan | 360/38.1 |
| 4,074,149 | 2/1978 | Noaijer | 307/359 |
| 4,142,208 | 2/1979 | Oprandi | 360/33.1 |
| 4,418,406 | 11/1983 | Ogawa | 369/124 |

Primary Examiner—Alan Faber
Attorney, Agent, or Firm—Robert T. Mayer; Algy Tamoshunas

[57] ABSTRACT

For the conversion of a signal read from a record carrier into a rectangular signal, a threshold-value circuit is used, whose threshold value is determined by a reference signal. The reference signal is derived from a d.c. component in the converted signal. During a dropout in the signal being read, the reference signal is maintained at the level which it had before the occurrence of the dropout.

3 Claims, 8 Drawing Figures

DROPOUT CIRCUIT ARRANGEMENT FOR CONVERTING AN INFORMATION SIGNAL INTO A RECTANGULAR SIGNAL

The invention relates to a circuit arrangement for converting an information signal read from a record carrier into a rectangular signal, which circuit arrangement comprises a threshold-value circuit having a first input for receiving the information signal, a second input voltage for receiving a reference signal, and an output, which threshold value circuit is adapted to produce a rectangular output signal on its output, whose edges correspond to the instants at which the information signal passes through the value of the reference signal, and a control device for generating the reference signal for the threshold-value circuit depending on the information signal being read.

Such a circuit arrangement is known from Netherlands Patent Application No. 77.07852, corresponding to U.S. Pat. No. 4,142,208, which mainly relates to an optical read apparatus for a record carrier having an optically detectable information structure. Examples of such record carriers are video disks (VLP), in which a video signal has been recorded in the form of a pattern of pits which, for example, represents a combination of an FM and pulse-width modulated carrier wave, and digital audio disks (DAD), in which a digitally encoded audio signal has been recorded in the form of a pattern of pits.

Reading such a record carrier is effected by means of a radiation beam, for which in principle two read processes, described in the said Netherlands Patent Application, may be used, namely:

(1) a read process employing two read detectors which are movable relative to each other in the track direction and whose output signals are applied to a differential amplifier. This so-called differential read method provides a signal which in principle contains no d.c. component but only an a.c. signal which represents the information.

(2) a read process employing only one read detector. This so-called central-aperture read method yields a signal which, in addition to an a.c. component representing the information, contains a d.c. component.

Both read methods yield an a.c. component, the information signal, having finite steep edges because of the limited bandwidth of the read process. In order to convert the resulting information signal into a rectangular signal use is made of a threshold-value circuit, which compares the information signal with a reference signal and which supplies a binary signal whose value depends on whether the information signal is greater or smaller than the reference signal.

Furthermore, said Netherlands Patent Application states that it is desirable to adapt the reference signal automatically to the converted information signal, specifically the d.c. component in said converted information signal. This is desirable because tolerances in the read process and/or the adjustment of the electronic circuit may give rise to a certain discrepancy between a reference value setting and the average value of the information signal read, which results in the converted information signal containing a spurious component in the form of an undesired pulse-width modulation. Said spurious component can be reduced by determining the average d.c. component of the converted information signal and correcting the value of the reference signal in response thereto.

In the case of the so-called central-aperture read method said reference signal should be equal to the average d.c. component in the information signal being read. Since said average d.c. component may vary as a result of varying properties of the record carrier, for example variations in the reflection coefficient when reading is effected by reflection, and variations in the intensity of the radiation beam, this read method also requires a correction of the reference signal for these reasons.

However, it has been found that when using this circuit arrangement dropouts in the information signal being read, for example as a result of flaws in the record carrier, may have an adverse effect on the converted signal.

It is an object of the invention to reduce the adverse effect of said dropouts in a simple manner and to this end the invention is characterized in that the circuit arrangement further comprises a dropout detector for detecting dropouts in the information signal being read, and switching means coupled to said dropout detector for during the dropout maintaining the reference signal applied to the threshold-value circuit at substantially the value of the reference signal at the beginning of the dropout.

The invention is based on the recognition that during the occurrence of a dropout the information signal, and thus its d.c. component, may become disturbed substantially, in particular when the so-called central-aperture read method is used. Via the automatic control of the reference signal, said reference signal will then have an incorrect value at the end of a dropout. Since, in addition, the time constant of said automatic control system is comparatively large because said control system should not respond to the desired pulse-width modulation in the information signal, it will take a comparatively long time before said reference signal has been restored to the said value. This means that the conversion of the information signal may remain disturbed for a time which is substantially longer than the duration of the dropout.

By rendering the correction of the reference signal inoperative during the dropout it is achieved, in accordance with the invention, that immediately after termination of the dropout said reference signal is restored to substantially the desired value and conversion is again effected correctly.

As a dropout detector, any known detector may be used. For example, dropout detectors are known which respond to amplitude variations in the information signal, to the occurrence of normally absent frequency components and the like. Which dropout detector is selected obviously depends on the signal format, that is the modulation techniques used for the information signal, and on the read method.

If the information signal is a digitally encoded signal, the maximum spacing between consecutive edges is generally known, depending on the adopted encoding technique. In that case, the circuit arrangement in accordance with the invention is suitably characterized in that the dropout detector comprises a retriggerable monostable multivibrator, which is coupled to the output of the threshold-value circuit. By selecting the reset time of the monostable multivibrator slightly greater than the maximum spacing between the consecutive edges, a very simple dropout detector can be obtained which is sufficiently accurate for the present purpose.

A preferred embodiment of the circuit arrangement in accordance with the invention is characterized in that the control device comprises an integrator which is coupled to the output of the threshold-value circuit and the switching means are adapted to uncouple the input of said integrator during the occurrence of a dropout. This embodiment has the advantage that only a limited number of additional components are required. This is possible because the integrator can perform a double function, namely the detection of the average d.c. level of the converted information signal and the function of a hold circuit for storing the value of the reference signal during a dropout.

Figure 2:
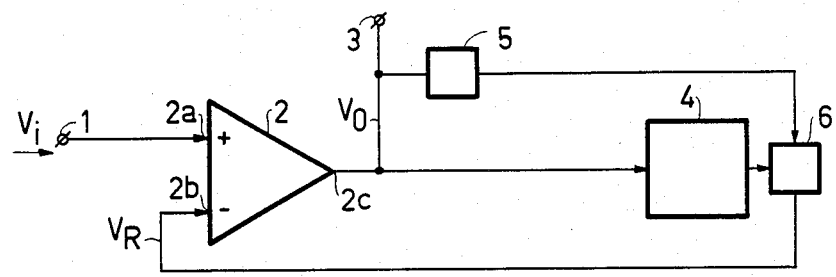
Figure 3:
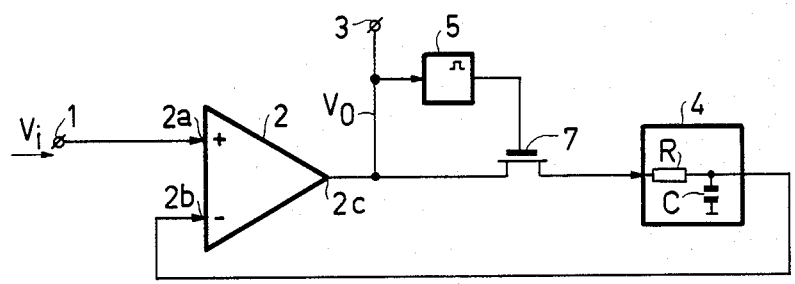
Figure 4:
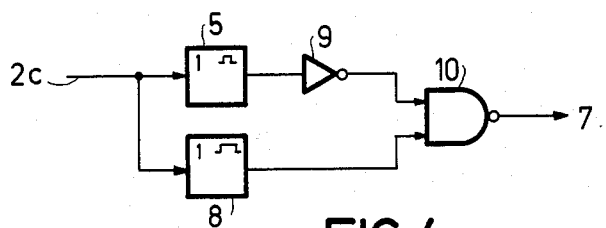
Figure 5:
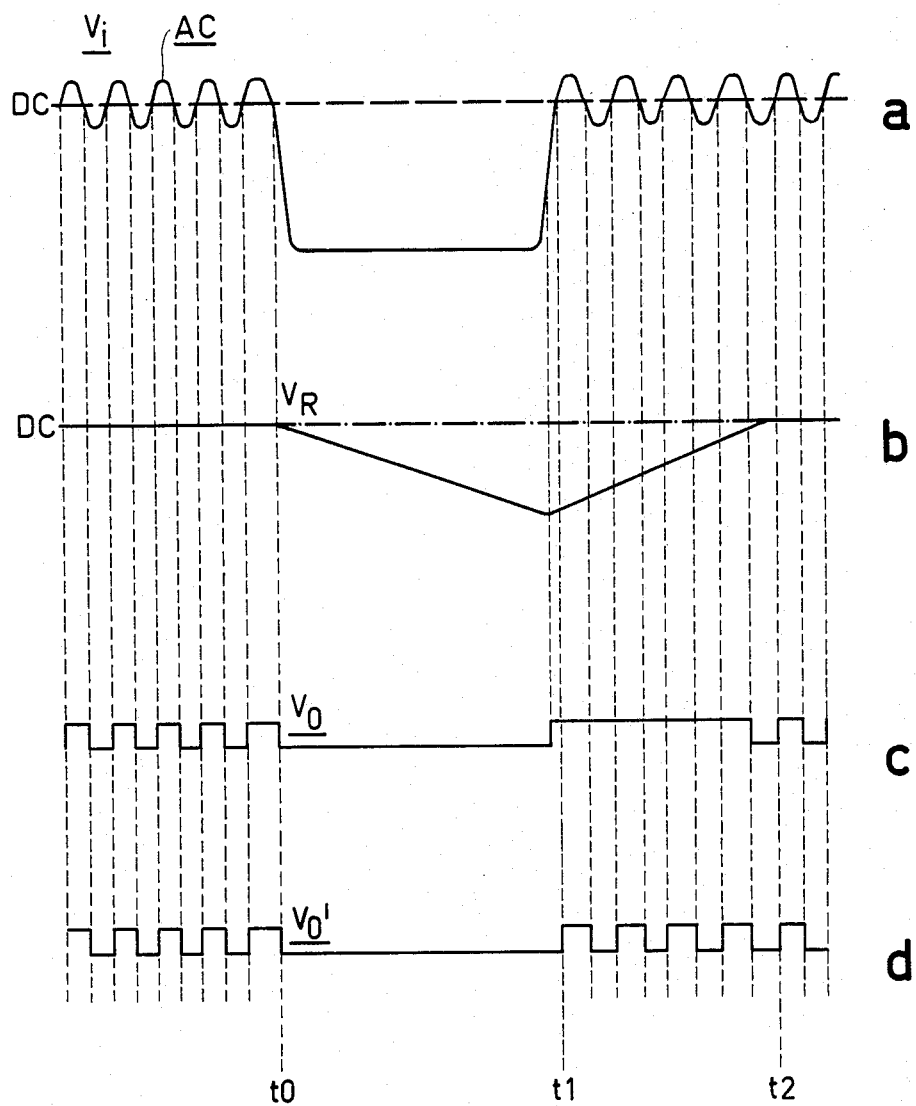

The invention will now be described in more detail with reference to the Figures, in which FIG. 1 schematically represents the known circuit arrangement, FIGS. 2 and 3 show two embodiments of the circuit arrangement in accordance with the invention, FIG. 4 shows a variant of the embodiment shown in FIG. 3, and FIG. 5, consisting of $a$–$d$, represents the signals associated with the various circuit arrangements.

The known circuit arrangement shown in FIG. 1 comprises an input terminal 1, to which the read signal $V_i$ is applied. Signal $V_i$ is represented in FIG. 5a and in this case comprises a DC component DC on which an AC component AC is superimposed. The a.c. component represents the actual information signal. Such an information signal is inter alia obtained when reading an optical record carrier in which the information is recorded in a pattern of pits, reading being effected by means of the so-called central-aperture mode.

In order to convert the information signal into a rectangular signal, the circuit arrangement comprises a threshold-value circuit 2 having an input 2a which is connected to the input terminal 1, an input 2b which receives a reference signal $V_R$, and an output 2c which is connected to the output terminal 3 of the arrangement. Said threshold-value circuit 2 compares the information signal $V_i$ on its input 2a with the value of the reference signal $V_R$ on its input 2b and supplies a rectangular output signal $V_o$ depending on the result of this comparison. A very simple version of this threshold-value circuit comprises a differential amplifier having such a high gain that the output voltage is limited by the positive or the negative power supply voltage, depending on the polarity of the input difference signal.

The reference signal $V_R$ is generated by means of a detector 4, which measures the average d.c. level of the resulting rectangular output signal $V_o$. Assuming that the information signal does not contain a d.c. component DC, which is generally the case, the resulting rectangular output signal $V_o$ should on the average contain no d.c. component DC. When a d.c. component DC is measured in said output signal $V_o$ and the reference signal is corrected in response thereto, said reference signal $V_R$ is automatically maintained at a correct signal. In the example given in FIG. 5 the value of the reference value $V_R$ (represented in FIG. 5b) will be equal to the value of the d.c. component DC in the signal being read. Slow variations in said d.c. component are automatically compensated for by adaptation of the reference signal.

If in the known circuit arrangement a dropout occurs in the signal being read, as is indicated in FIG. 5a in the time interval $t_0$–$t_1$, the conversion is disturbed considerably. During said dropout the output signal $V_o$ will not be rectangular, but will continuously assume one of the two possible signal values. Since the detector 4 interprets this as the absence of a d.c. component in the output signal $V_o$, said detector will change the reference signal $V_R$.

The speed with which the reference signal is changed depends on the time constant of the detector. Generally a comparatively large time constant will be selected to render the control of the reference signal independent of low-frequency components in the information signal. In spite of this the reference signal may already exhibit a substantial deviation from the desired value DC at the end of the dropout ($t_1$) in the case of a comparatively large dropout. This means that after the end of the dropout, the output signal is not yet rectangular. Said reference signal will be restored, but this is effected with said comparatively large time constant, so that it is not until after the instant $t_2$ that the information signal $V_i$ and the reference signal $V_R$ exhibit intersections at the correct instants. This means that a dropout of a specific duration ($t_0$–$t_1$) may disturb the output signal even for a substantially longer time interval ($t_0$–$t_2$). One way to mitigate this, would be to limit the range in which the reference signal can vary. However, in the case of the central-aperture method this gives rise to problems, because the variation of said reference signal should at least be equal to the possible shift of the d.c. level DC in the information signal.

FIG. 2 schematically represents an embodiment of the circuit arrangement in accordance with the invention by means of which said disadvantage can be mitigated very simply. Similar elements in this Figure bear the same reference numerals as in FIG. 1.

The circuit arrangement shown in FIG. 2, as an addition to the arrangement shown in FIG. 1, firstly comprises a dropout detector 5. Said dropout detector has the sole function of supplying a detection signal during the occurrence of a dropout and may be adapted to the nature of the information signal, in any known manner. For example dropout detectors are known which respond to the amplitude of the signal, dropout detectors which respond to the occurrence of normally absent frequency components and the like. The method of dropout detection is of subordinate importance for the present invention. For example, instead of the output signal $V_o$ the information signal $V_i$ itself may be applied to the dropout detector 5, dropout detection being effected through amplitude detection.

The detection signal supplied by the dropout detector is applied to a hold circuit 6, which is connected to the output of the detector 4 and to the input 2b of the threshold-value circuit 2. During a dropout, hold circuit 6 maintains the reference signal $V_R$ at the value of the signal at the beginning of the dropout (see dash-dot line in FIG. 5b). As a result of this, the reference signal is immediately restored to the correct value at the end of the dropout (instant $t_1$), so that from the instant $t_1$ conversion is possible again (see FIG. 5d). The adverse effect of dropouts on said conversion is thus substantially reduced in a very simple manner.

FIG. 3 shows a very simple embodiment of the circuit arrangement in accordance with the invention.

The detector 4 simply comprises an integrator in the form of an RC-network. Instead of a hold circuit at the output of the detector 4, the circuit arrangement comprises a transistor 7 which functions as a switch, between the output of the threshold-value circuit 2 and the input of the detector 4. During a dropout the transistor 7 is turned off by the dropout detector 5, so that the input of the detector 4 is disconnected. Since the input 2b of the differential amplifier 2 generally has a high impedance the capacitance c of the integrator then functions as hold circuit during the dropout.

By way of illustration FIG. 3 shows that the dropout detector may comprise a retriggable monostable multivibrator. This very simple version of the dropout detector may be used when it is known what the maximum spacing is between two consecutive edges of the information signal. This is certainly so in the case of digital information signals, because this parameter is subject to limitations by the choice of the encoding and modulation system. If the reset time of the monostable multivibrator is selected to be slightly greater than this maximum value, said monostable multivibrator will automatically function as dropout detector.

FIG. 4 shows a variant to the dropout detector shown in FIG. 3. In addition to the monostable multivibrator 5 the detector comprises a second retriggable monostable 8, which has a substantially longer reset time. The output of the multivibrator 8 is connected directly and that of the multivibrator 5 via an inverter 9 to a NAND-gate 10, whose output drives the switching transistor 7 (FIG. 3).

By means of this circuit arrangement it is achieved that in the case of a very long dropout, after a time interval determined by the reset time of the multivibrator 8, the switching transistor 7 re-connects the integrator 4 (FIG. 3). This arrangement prevents a sudden and lasting change in the d.c. level DC from being interpreted as a dropout, as a result of which conversion would remain disturbed. The circuit arrangement shown in FIG. 4 resumes detection after a specific time in case that the situation has changed.

It will be evident that the invention is by no means limited to the embodiments shown. The average person skilled in the art will be able to device many variants using the principle underlying the invention.

What is claimed is:

1. A circuit arrangement for converting an information signal read from a record carrier into a rectangular signal, which arrangement comprises a threshold-value circuit having a first input for receiving the information signal, a second input for receiving a reference signal, and an output, which threshold-value circuit is adapted to produce a rectangular output signal on its output, whose edges correspond to the instants at which the information signal passes through the value of the reference signal, and means for generating the reference signal for the threshold-value circuit depending on the information signal being read, means for detecting dropouts in the information signal being read, and means coupled to said dropout detecting means for maintaining, during the dropout, the reference signal applied to the threshold-value circuit at substantially the value of the reference signal at the beginning of the dropout.

2. A circuit arrangement as claimed in claim 1, wherein said dropout detecting means comprises a retriggable monostable multivibrator, which is coupled to the output of the threshold-value circuit.

3. A circuit arrangement as claimed in claim 1, wherein said generating means comprises an integrator which is coupled to the output of the threshold-value circuit and said maintaining means comprises switching means responsive to said detecting means for uncoupling the input of said integrator during the occurrence of a dropout.

* * * * *